(12) United States Patent
Usami

(10) Patent No.: US 7,256,739 B2
(45) Date of Patent: Aug. 14, 2007

(54) ANTENNA FOR RADIO FREQUENCY IDENTIFICATION

(75) Inventor: Mitsuo Usami, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/002,083

(22) Filed: Dec. 3, 2004

(65) Prior Publication Data
US 2005/0134460 A1   Jun. 23, 2005

(30) Foreign Application Priority Data
Dec. 4, 2003   (JP)   ............... 2003-406031

(51) Int. Cl.
*H01Q 1/38*   (2006.01)
(52) U.S. Cl. ............... 343/700 MS; 343/720; 340/572.7
(58) Field of Classification Search ......... 343/700 MS, 343/702, 767, 720, 873; 340/572.7
See application file for complete search history.

(56) References Cited

U.S. PATENT DOCUMENTS

| 6,100,804 A | 8/2000 | Brady | ............ 340/572.7 |
|---|---|---|---|
| 6,215,402 B1 * | 4/2001 | Rao Kodukula et al. | 340/572.8 |
| 6,392,609 B2 * | 5/2002 | Nieminen | ............ 343/767 |
| 2003/0063002 A1 | 4/2003 | Okamoto et al. | |
| 2003/0112192 A1 | 6/2003 | King et al. | |

FOREIGN PATENT DOCUMENTS

| WO | WO 02/095870 A | 11/2002 |
|---|---|---|
| WO | WO 03/096478 A | 11/2003 |

* cited by examiner

*Primary Examiner*—Michael C. Wimer
(74) *Attorney, Agent, or Firm*—Mattingly, Stanger, Malur & Brundidge, PC

(57) ABSTRACT

To provide an antenna shape devised to be integrated and compact. The antenna connected to an IC chip that performs wireless identification includes a slit that separates two connection points with respect to the IC chip, in which a length of the slit is approximately 3 millimeters, and a width of the slit is in a range of from 0.8 millimeter to 1.4 millimeters.

18 Claims, 13 Drawing Sheets

ANTENNA FOR RADIO FREQUENCY IDENTIFICATION

CLAIM OF PRIORITY

The present application claims priority from Japanese application P2003-406031 filed on Dec. 4, 2004, the content of which is hereby incorporated by reference into this application.

BACKGROUND OF THE INVENTION

This invention relates to an antenna for radio frequency identification that performs wireless identification, in particular, miniaturization thereof.

Conventionally, a technology has been proposed with which impedance matching of an antenna for radio frequency identification (RFID) is established using an antenna pattern existing parallel to a main antenna.

Generally, the highest efficiency is attained with an antenna having a length that is half of the wavelength of a frequency (λ/2) used and there is also a case where a λ/4 grounded antenna is used for the sake of miniaturization of a device (refer to U.S. Pat. No. 6,100,804 B).

SUMMARY OF THE INVENTION

In the conventional technique described above, however, an antenna is constructed of plural separated antenna patterns, thereby being difficult to realize a compact antenna using such a construction.

RFID is attached to merchandise or a product so that merchandise control, product quality control, or the like is performed by utilizing the ID number or the like possessed by the RFID. Under the Radio Law in Japan, the main frequency bands that the RFID can use are 2.45 gigahertz, 13.56 megahertz, and 125 kilohertz. Even when 2.45 gigahertz is used, its half-wavelength is approximately 6 centimeters. Thus, when importance is placed on the efficiency of an antenna, the size of the antenna becomes as large as approximately 6 centimeters.

Here, the size (length, width) of the RFID is determined by the size of the antenna, which results in a situation where the size of the RFID exceeds the size of merchandise or a product to which the RFID is to be attached, assuming that the merchandise or product is a small object such as a medicine bottle. Such a situation where the size of the RFID exceeds the size of the merchandise or product, to which the RFID is to be attached, is not preferable because there occur various problems in that the RFID is peeled off during production, distribution, transportation, or the like of the merchandise or product.

Accordingly, it is desired to devise an antenna that can be unified and compact. It is therefore an object of this invention to reduce the size of an antenna, thereby achieving a reduction in size of the RFID itself using the antenna, and providing the RFID or the like that does not exceed the size of an object to which the RFID or the like is to be attached.

According to an embodiment of this invention, an antenna connected to an IC chip that performs wireless identification, includes a slit that separates two connection points with respect to the IC chip, in which, a length of the slit is approximately 3 millimeters; and a width of the slit is in a range of from 0.8 millimeter to 1.4 millimeters.

In another view point, according to the embodiment of this invention, an antenna connected to an IC chip that performs wireless identification, comprising a slit that separates two connection points with respect to the IC chip, in which, a length of the slit is in a range of from 2.4 millimeters to 3.0 millimeters, a width of the slit is in a range of from 1.0 millimeter to 1.4 millimeters, and an area of the slit is in a range of from 3.0 square millimeters to 4.2 square millimeters.

In another view point, according to the embodiment of this invention, an antenna connected to an IC chip that performs wireless identification, comprising a slit that separates two connection points with respect to the IC chip, in which a length and a width of the slit are approximately equal to each other, and the length and the width of the slit each is in a range of from 2.0 millimeters to 2.4 millimeters.

According to the embodiment of this invention, it is possible to produce an integrated and compact antenna.

BRIEF DESCRIPTION OF THE DRAWINGS

The present invention can be appreciated by the description which follows in conjunction with the following figures, wherein.

DETAILED DESCRIPTION OF THE PREFERRED EMBODIMENTS

When the size of an antenna is set smaller than the half-wavelength of a frequency used, due to the properties thereof, it is impossible to obtain a resonant condition so that efficient transmission and reception cannot be performed using effectively the maximum electric power. Also, it is required to pass electric power with efficiency at a connection from a high-frequency output circuit to an antenna and to prevent a radio wave reflection problem from occurring. Therefore, in an embodiment of this invention, a demerit resulting from a situation where no resonance is obtained due to a reduction in size of an antenna to less than a half-wavelength is compensated for by matching the impedance of the circuit (which is typically a semiconductor integrated circuit) of RFID to that of the antenna.

The embodiments of this invention will now be described with reference to the accompanying drawings.

Figure 1A:
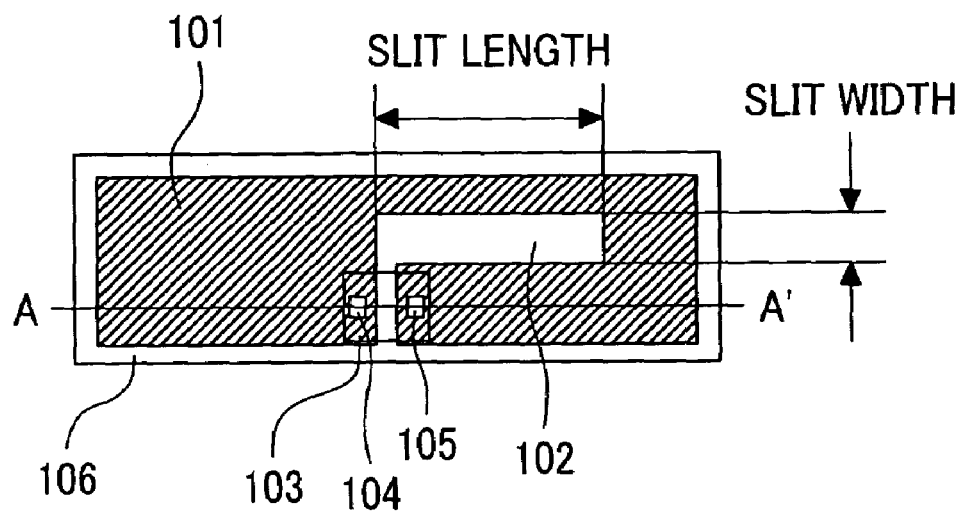
FIG. 1A is a plane view of RFID using an antenna according to a first embodiment of this invention.
Figure 1B:
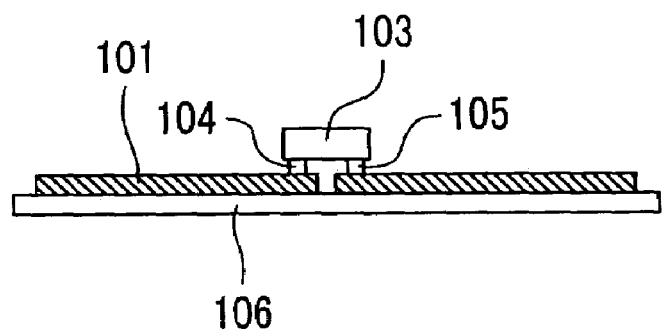
FIG. 1B is a cross-sectional view of the RFID taken along the line A-A' shown in FIG. 1A.

FIG. 1A is a plane view of RFID using an antenna according to a first embodiment of this invention and FIG. 1B is a cross-sectional view taken along the line A-A' of FIG. 1A.

An antenna 101 is formed on a base film 106 using a conductive pattern and a slit 102 is established in the antenna 101. An RFID chip 103 is provided with a first bump 104 and a second bump 105 and the RFID chip 103 and the antenna 101 are connected to each other through the bumps 104 and 105 serving as connection points. The impedance between the bumps 104 and 105 (input impedance of the RFID chip 103) is adjusted to 60 ohms at 2.45 gigahertz, for instance. It should be noted that a construction may also be used in which the length of the antenna is shortened by using a high-dielectric-constant base material as the base film 106.

In the embodiment of this invention, by providing the antenna 101 with the slit 102, impedance matching between the antenna 101 and the RFID chip 103 is established.

When a microwave of 2.45 gigahertz is irradiated to the antenna 101, a high-frequency current is caused to flow through the antenna 101. Under this state, when matching is established between the input impedance (60 Ω) of the RFID chip 103 and the impedance of the antenna, the high-frequency current flowing through the antenna 101 can be supplied to the RFID chip 103 with the highest efficiency. On the other hand, when the matching between the input impedance of the RFID chip 103 and the impedance of the antenna is incomplete, as the high-frequency current is reflected at the connection points (bumps 104 and 105) therebetween, sufficient energy cannot be supplied to the RFID chip 103 to operate. As a result, the strength of a signal inputted into the RFID chip 103 is weakened.

Figure 2:
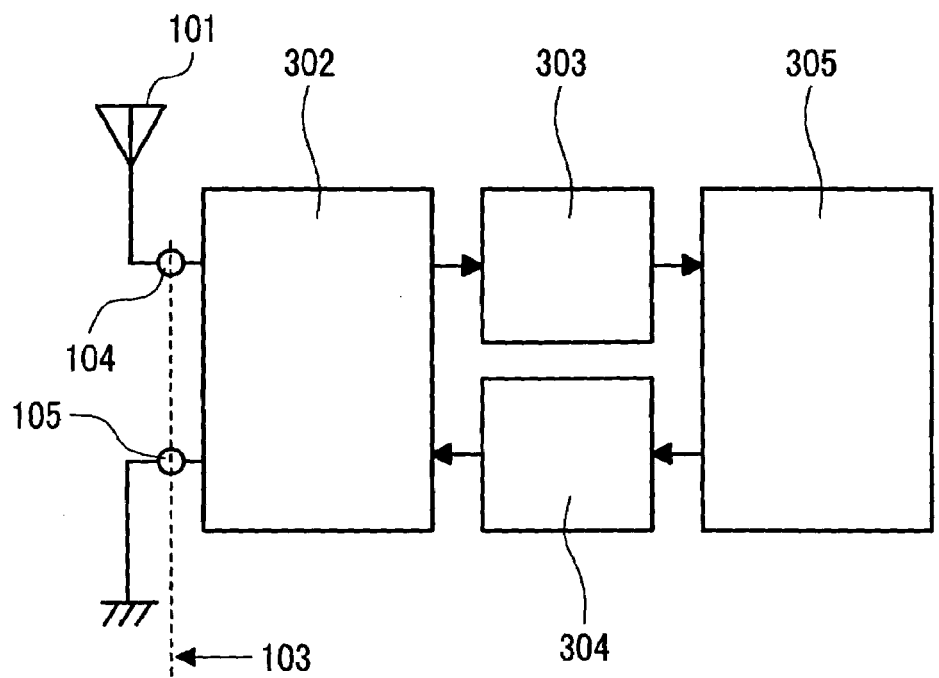
FIG. 2 is a block diagram showing a construction of the RFID according to the embodiment of this invention.

FIG. 2 is a block diagram showing a construction of the RFID according to the embodiment of this invention.

The RFID chip 103 includes a rectifier circuit 302, a clock extracting circuit 303, a load switch 304, and a counter/memory circuit 305.

The antenna 101 is connected to the rectifier circuit 302. The high-frequency current flowing through the antenna 101 is rectified by the rectifier circuit 302 and then is inputted into the clock extracting circuit 303. In the clock extracting circuit 303, a clock width and a clock interval are extracted from a high-frequency carrier with precision. An extracted low-frequency clock pulse is inputted into the counter/memory circuit 305, which then performs processing such as certification of the RFID.

An output from the counter/memory circuit 305 is inputted into the load switch 304. The load switch 304 is a switching device composed of MOSFETs and performs load modulation by changing impedance with respect to the antenna 101 (impedance between the bumps 104 and 105). A modulated signal is transmitted from the antenna 101 to a reader for the RFID as data.

The input impedance of the rectifier circuit 302 is determined by the value of its internal load, in other words, the scheme adopted by the rectifier circuit 302, the shape of rectifiers, the parasitic effect of the rectifier circuit, and the like. In the high-frequency rectifier circuit 302, its parasitic capacitance is a significant impedance factor. Therefore, when the matching between the antenna 101 and the rectifier circuit 302 is insufficient, the energy from the antenna 101 is not sufficiently supplied to the rectifier circuit 302. In order to establish matching at a high frequency, an antenna line is required to be dealt with as a distributed constant circuit. It is also required that the antenna 101 functions not only as a resonant circuit but also as a matching circuit for the high-frequency current to the RFID chip. In this case, the matching means a situation where the high-frequency current is inputted from the antenna 101 to the RFID chip 103 without being reflected in a transition portion to a different system (connection points between the antenna 101 and the RFID chip 103).

Therefore, it is required to provide the antenna with a matching circuit. In the embodiment of this invention, the slit 102 is formed in a terminal portion (between the bumps 104 and 105) of the RFID chip 103. In other words, it is required that the RFID chip 103 is provided at an end portion of the slit 102. This slit 102 is at the same voltage in terms of a direct current. A current, however, flows in an alternating manner, so a shape of the slit 102 is important. The slit 102 forms a current distributed constant circuit with respect to the input terminals (bumps 104 and 105) of the RFID chip 103.

Figure 3:
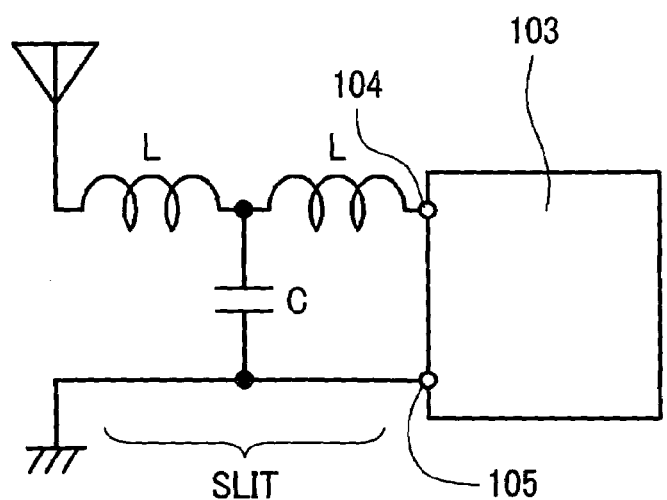
FIG. 3 is a block diagram showing the principle of operation of the antenna for the RFID according to the embodiment of this invention.

FIG. 3 is a block diagram showing the principle of operation of the antenna for the RFID according to the embodiment of this invention and shows the equivalent circuit of the slit 102 when the antenna 101 is connected to the RFID chip 103.

The slit 102 constitutes the distributed constant circuit, an inductance L exists along a slit length, and a capacitance C exists inversely proportional to a slit width. The characteristic impedance of the distributed constant circuit is expressed by a square root found by dividing the inductance L by the capacitance C. Consequently, the slit length is in an approximately proportional relation with the inductance L and when the slit length is lengthen, the inductance L is increased. The slit width is in an approximately inversely proportional relation with the capacitance C and when the slit width is widened, the capacitance C is decreased.

When matching is established by setting the terminals of the distributed constant circuit so as to have the same impedance, energy can be transmitted without reflection. When the slit width is increased, the capacitance C is decreased. Accordingly, in order to maintain the characteristic impedance at the same level, it is required to decrease the inductance L by electrically shortening the slit length.

Even when the input impedance of the RFID chip is changed, impedance matching can be established by freely adjusting matching based on the slit length and the slit width in the manner described above. Also, when the slit length is short, a compact antenna can be easily realized. Further, with the large slit width, production accuracy is not need to be very high (aluminum punching becomes usable, for instance), thereby making it possible to produce an antenna at a low price.

Figure 4:
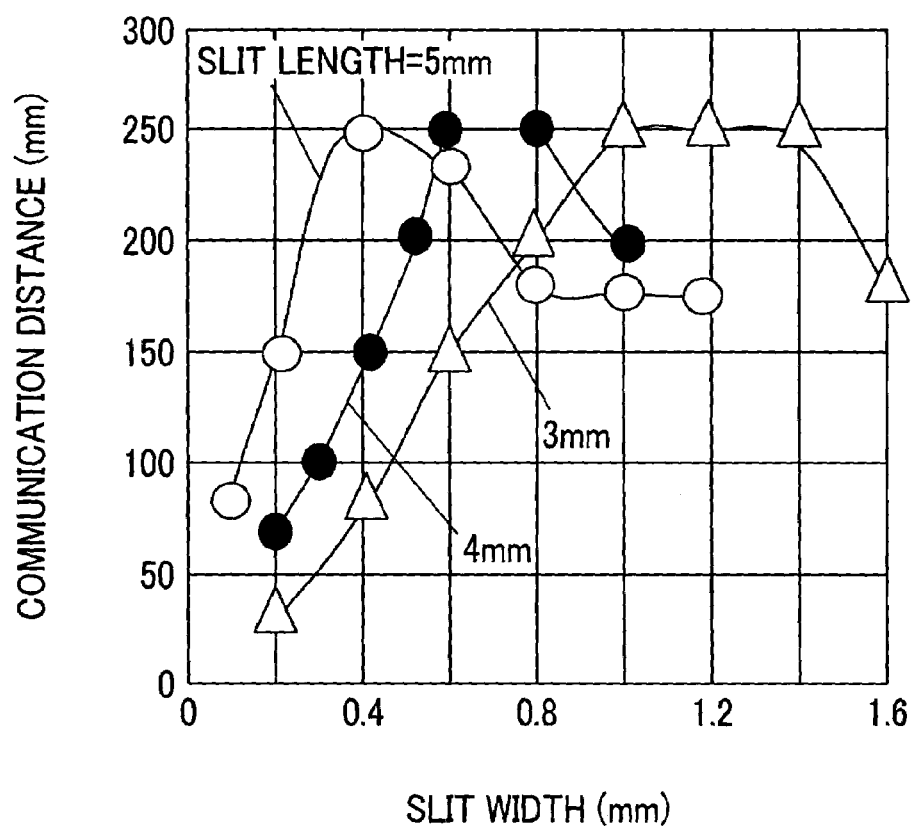
FIG. 4 is a characteristic diagram of the antenna for the RFID according to the embodiment of this invention.

FIG. 4 is a characteristic diagram of the antenna for the RFID according to the embodiment of this invention and shows results of an experiment where a communication distance between the antenna of the reader and the RFID is measured while changing the slit length and the slit width of the antenna shown in FIG. 1.

In FIG. 4, results obtained by setting the slit length to 3 millimeters, 4 millimeters, and 5 millimeters are shown in the diagram. It can be understood from this diagram that as the slit length is shortened, the slit width, with which the maximum communication distance is obtained, is increased and the range of the slit width where the maximum communication distance (250 millimeters) is obtained with stability is widened. Also, as described with FIG. 3, when the slit width is widened to reduce the capacitance C, it is required to reduce inductance L in order to maintain the characteristic impedance at the same level. In other words, it is required to electromagnetically shorten the slit length, which matches with the measurement data in FIG. 4. In FIG. 4, the maximum communication distance is saturated at 250 millimeters, which is not due to the antenna shape, but due to factors, such as an output from the reader, and the like.

In this invention, adjustment of the size (length and width) of the slit in order to establish impedance matching makes it possible to construct a compact antenna. In other words, unlike in the conventional case, it is not required to use a pattern separated from an antenna element, so an antenna can be constructed as being integrated, rectangular, and compact. Further, by increasing the slit width, the slit length can be shortened miniaturize the antenna. This means that it is possible to shorten the whole of the antenna, and important conditions for constructing a compact antenna with this invention have been determined. It can be understood from FIG. 4 that the communication distance is stabilized with the slit width of 0.4 millimeters or more.

Figure 5:
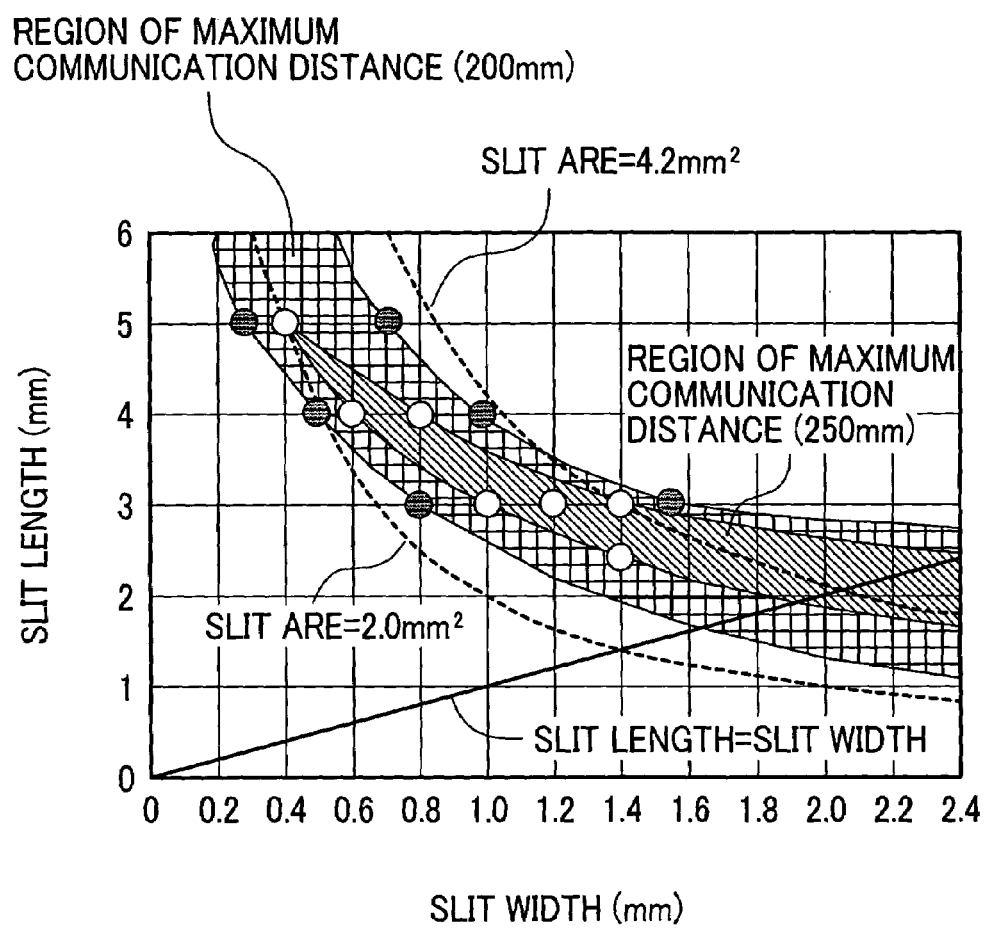
FIG. 5 is another characteristic diagram of the antenna for the RFID according to the embodiment of this invention.

FIG. 5 is another characteristic diagram of the antenna for the RFID according to the embodiment of this invention and shows the measurement data shown in FIG. 4 as a relation between the slit width and the slit length.

FIG. 5 shows a region where a communication distance of 200 millimeters is obtained and a region where the maximum communication distance (250 millimeters) is obtained.

It can be understood from FIG. 5 that it is possible to increase the slit width by shortening the slit length. In addition, it also can be understood that when the slit length is shortened, the allowable range of the slit width is widened. This is conceivably because a strict distributed constant circuit becomes a mixed model of a distributed constant circuit and a concentrated constant circuit, as the slit width is required to be widened with the slit length shortened.

More specifically, when the slit length is 5 millimeters, it is required to construct the antenna under a severe condition where the slit width is 0.4 millimeters while the size the antenna being set so as to have a length that is equal to or more than the slit length (5 millimeters). On the other hand, when the slit length is 3 millimeters, it is possible to obtain the maximum communication distance with the slit width between 1.0 millimeters and 1.4 millimeters. As a result, it is possible to produce a compact antenna with alleviated production accuracy, using economical specifications, and at low cost.

As shown in FIG. 6A to FIG. 8B, the area of the antenna is the sum total of the area of a conductor forming the antenna and the area of the slit. By setting a slit size with the slit length being 2.4 millimeters through 3.0 millimeters, the slit width being 1.0 millimeters through 1.4 millimeters, and the slit area being 3.0 millimeters through 4.2 millimeters, a compact antenna can be produced with maximum size (length or width) being 3.0 millimeters or less, while obtaining the maximum communication distance or a communication distance close to maximum.

Also, as shown in FIG. 5 to FIG. 12, the maximum size (length or width) of the antenna according to the embodiment of this invention is defined by the slit length and slit width thereof and is determined by the size of greater one of the slit length and the slit width.

In other words, when the slit length is greater than the slit width (slit length>slit width), the antenna length is greater than the antenna width (antenna length>antenna width) and the maximum size of the antenna is determined by the antenna length. In this case, for instance, the maximum size of the antenna is the sum total of the width of the conductor forming the antenna and the slit length. On the other hand, when the slit length is smaller than the slit width (slit length<slit width), the antenna length is smaller than the antenna width (antenna length<antenna width) and the maximum size of the antenna is determined by the antenna width.

Accordingly, the maximum size of the antenna is to be the minimum at a point where the antenna length and the antenna width are equal to each other (antenna length=antenna width). In this case, for instance, the maximum size of the antenna is the sum total of the width of the conductor forming the antenna and the slit width. In other words, the maximum size of the antenna becomes the minimum when the slit length and the slit width are set equal to each other. In FIG. 13, an example of an antenna constructed in this manner is shown. Also, in FIG. 5, illustrated is a straight line expressing points where the slit length and the slit width are equal to each other.

Consequently, when the slit is formed so as to have a slit size on the straight line expressing the points where the slit length and the slit width are equal to each other in the region shown in FIG. 5 where the maximum communication distance is obtained, or in other words, when the slit is formed so that the slit length and the slit width are equal to each other and is 2.0 millimeters through 2.4 millimeters, the maximum size of the antenna becomes the minimum while the maximum communication distance being obtained.

As can be understood from FIG. 5, by constructing the antenna in the shape according to the first embodiment of this invention, it is possible to produce a RFID chip where the antenna is miniaturized and a practical communication distance is secured while managing a reduction in communication distance due to the miniaturization. In addition, miniaturization of the antenna also makes it possible to miniaturize the RFID provided with the antenna, which widens the range of objects to which the RFID can be attached. For instance, the RFID can be attached to the lid portion of a small medicine bottle or the like.

Figure 6A:
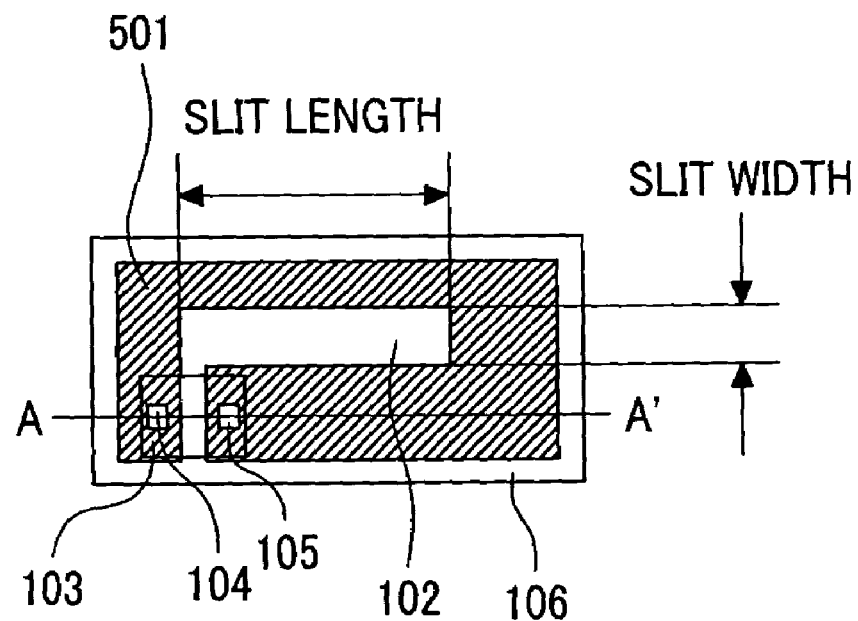
FIG. 6A is a plane view of RFID using an antenna according to a second embodiment of this invention.
Figure 6B:
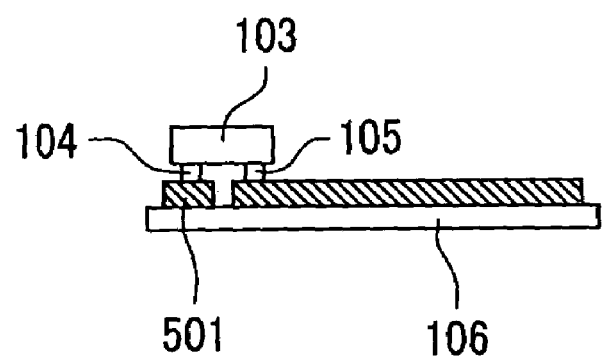
FIG. 6B is a cross-sectional view of the RFID taken along the line A-A' shown in FIG. 6A.

FIG. 6A is a plane view of RFID using an antenna according to a second embodiment of this invention and FIG. 6B is a cross-sectional view taken along the line A-A' of FIG. 6A.

The antenna according to the second embodiment is a shortened antenna where the edge of the antenna is set close to the slit by narrowing the outer width of the antenna 501 (by setting the width of the conductor forming the antenna to 1 millimeter or less, for instance). It should be noted that each construction element that functions in the same manner as in the first embodiment described above is given the same reference numeral and the detailed description thereof will be omitted.

In the second embodiment, an antenna 501 is formed by a conductive pattern on a base film 106 and a slit 102 is established in the antenna 501. Also, the antenna 501 is connected to a first bump 104 and a second bump 105 provided for an RFID chip 103.

Figure 7A:
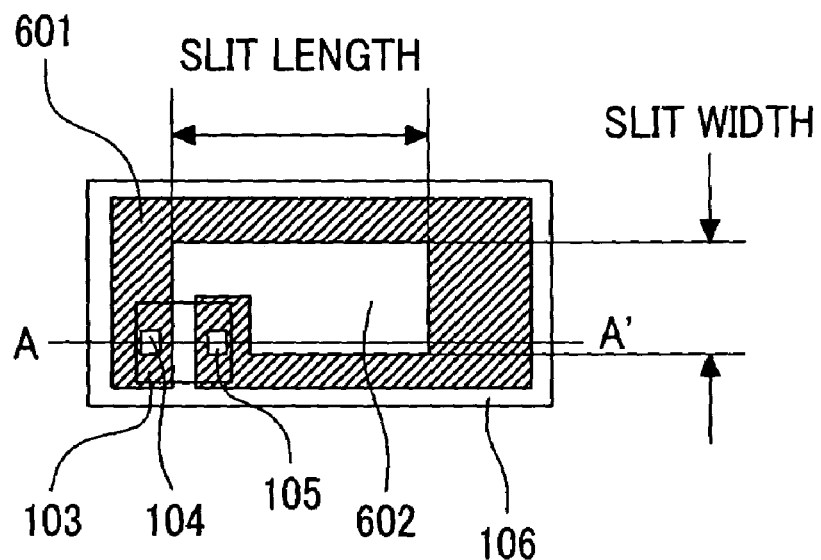
FIG. 7A is a plane view of RFID using an antenna according to a modification of the second embodiment of this invention.
Figure 7B:
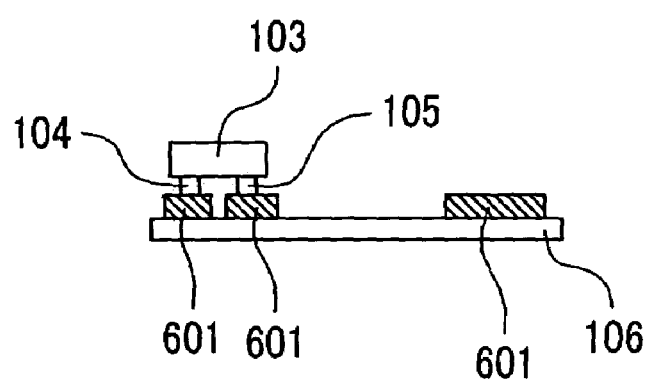
FIG. 7B is a cross-sectional view of the RFID taken along the line A-A' shown in FIG. 7A.

FIG. 7A is a plane view of RFID using an antenna as a modification according to the second embodiment of this invention and FIG. 7B is a cross-sectional view taken along the line A-A' of FIG. 7A.

In the modification according to the second embodiment, like in the first embodiment shown in FIG. 6, an antenna 601 is formed by a conductive pattern on a base film 106 and a slit 602 is established in the antenna 601. Also, the antenna 601 is connected to a first bump 104 and a second bump 105 provided for an RFID chip 103.

As described above, in the second embodiment, by narrowing the width of the electric conductor forming the outer portion of the antenna, the slit length can be shortened to make it further possible to miniaturize the antenna. Also, in the modification shown in FIG. 7, with the slit width 602 partially enlarged, it is possible to further shorten the slit length to miniaturize the antenna.

Figure 8A:
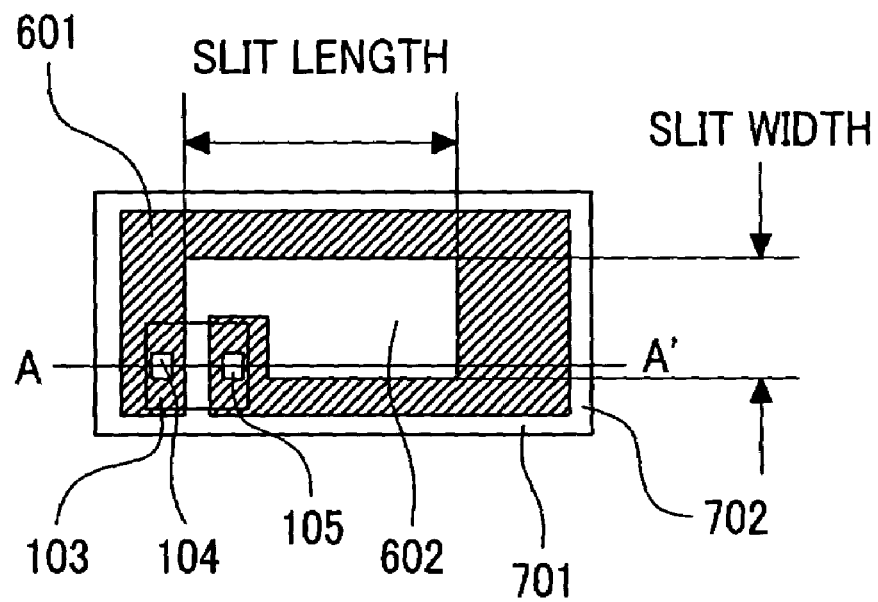
FIG. 8A is a plane view of RFID using an antenna according to a third embodiment of this invention.
Figure 8B:
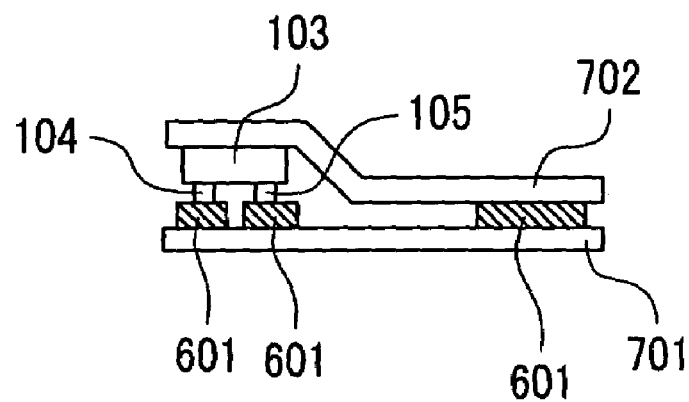
FIG. 8B is a cross-sectional view of the RFID taken along the line A-A' shown in FIG. 8A.

FIG. 8A is a plane view of RFID using an antenna according to a third embodiment of this invention and FIG. 8B is a cross-sectional view taken along the line A-A' of FIG. 8A.

The antenna according to the third embodiment is characterized in that a high-dielectric-constant cover sheet 702 is provided for the upper surface of the antenna 601. It should be noted that each construction element that functions in the same manner as in the first or second embodiment described above is given the same reference numeral and the detailed description thereof will be omitted.

In the third embodiment, an antenna 601 is formed by a conductive pattern on a high-dielectric-constant base film 701 and a slit 602 is established in the antenna 601. Also, the antenna 601 is connected to a first bump 104 and a second bump 105 provided for an RFID chip 103.

As described above, in the third embodiment, the high-dielectric-constant cover sheet 702 is provided so as to cover the upper surface of the antenna 601 and the antenna 601 is sandwiched between the high-dielectric-constant base film 701 and the high-dielectric-constant cover sheet 702. With this construction, a wavelength shortening effect is produced, which makes it possible to miniaturize the antenna without shortening the communication distance.

Figure 9:
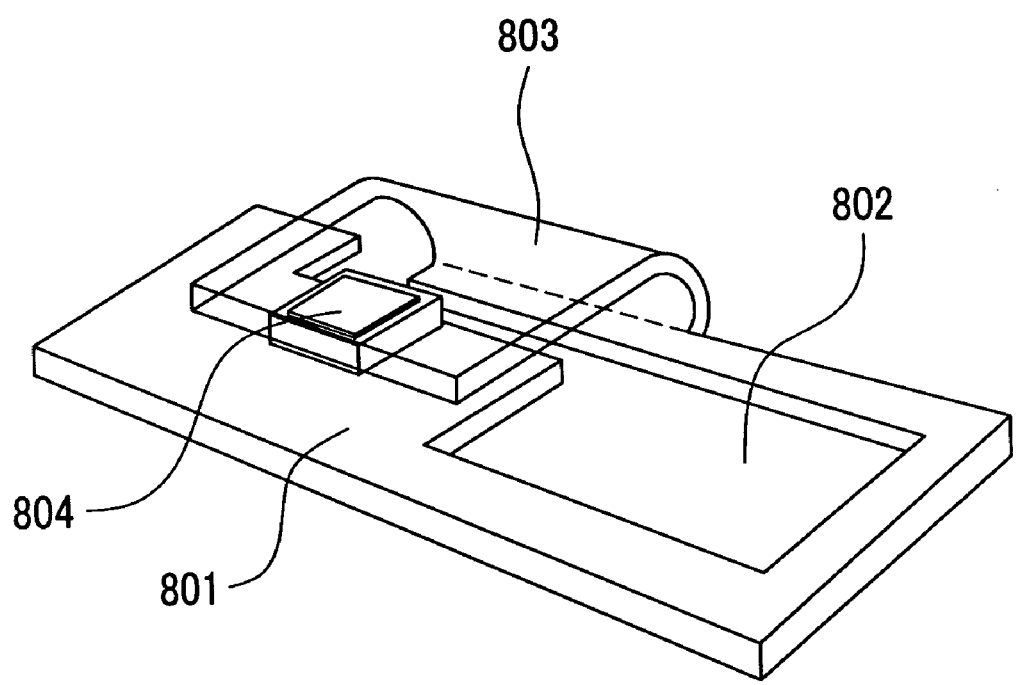
FIG. 9 is a perspective view of RFID using an antenna according to a fourth embodiment of this invention.

FIG. 9 is a perspective view of RFID using an antenna according to a fourth embodiment of this invention.

The RFID according to the fourth embodiment is characterized in that a RFID chip 804 with electrodes provided on both surfaces thereof is used. It should be noted that each construction element that functions in the same manner as in the first through third embodiments described above is given the same reference numeral and the detailed description thereof will be omitted.

An antenna 801 constituted of an electric conductor (conductive pattern provided on a base film, for instance) is provided with a slit 802 and a folded portion 803 extending from the antenna conductor is folded to a position overlapping the antenna 801. Also, the RFID chip 804 with electrodes provided on both surfaces thereof is arranged under the folded portion 803. In other words, one end of the antenna 801 is connected to one of the electrodes provided on the both surfaces of the RFID chip 804 and one end of the folded portion 803 is connected to the other of the electrodes of the RFID chip 804.

Even with the structure according to the fourth embodiment, illustrated in FIG. 4 is the relation between the slit length and the slit width. In order to construct an antenna having a short antenna length, it is important to shorten the slit length and to widen the slit width.

As described above, in the fourth embodiment, a sandwich structure is adopted in which the antenna 801 is folded and is connected to the electrodes provided on the both surfaces of the RFID chip 804, so it becomes possible to produce a more compact antenna.

Figure 10A:
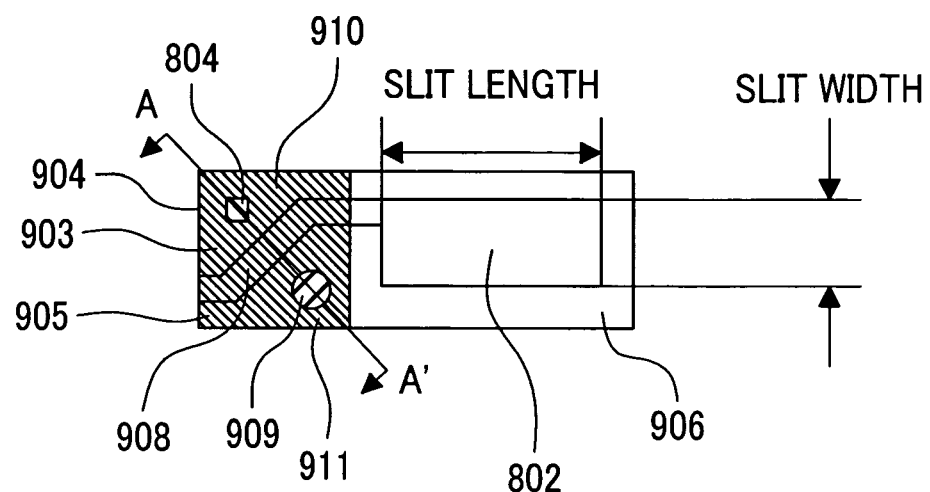
FIG. 10A is a plane view of RFID using an antenna according to a fifth embodiment of this invention.
Figure 10B:
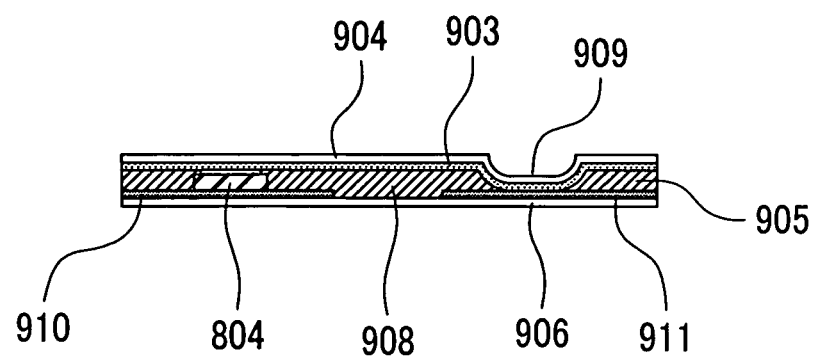
FIG. 10B is a cross-sectional view of the RFID taken along the line A-A' shown in FIG. 10A.

FIG. 10A is a plane view of RFID using an antenna according to a fifth embodiment of this invention and FIG. 10B is a cross-sectional view taken along the line A-A' of FIG. 10A.

The antenna for the RFID according to the fifth embodiment is characterized in that a slit is provided in a slanting direction. It should be noted that each construction element that functions in the same manner as in the first through fourth embodiments described above is given the same reference numeral and the detailed description thereof will be omitted.

An antenna 910 through 911 provided on a base film 906 has a slit 802. The slit 802 constitutes a separation groove 908 by extending in a slanting direction and separates the antenna into two end portions 910 and 911. The end portion 910 of the antenna is connected to one of electrodes provided on the both surfaces of an RFID chip 804. Also, the end portion 911 of the antenna is connected to a cover metal 903 provided for a cover film 904.

The conductive cover metal 903 is provided on a lower surface of the cover film 904. A layer of anisotropic conductive adhesives 905 is provided between the base film 906 and the cover film 904 (between the antenna 910 through 911 and the cover metal 903). The anisotropic conductive adhesives 905 do not have conductivity under an ordinary state but exhibits conductivity through application of a pressure in a direction in which the pressure is applied. Consequently, by applying a pressure at a short point 909 provided on an antenna 911 side on the base film 906 (applying a pressure from a cover film 904 side as shown in FIG. 10, for instance), electrical continuity is established between the antenna 911 of the base film 906 and the cover metal 903 of the cover film 904.

One of the electrodes of the RFID chip 804 is connected to the end portion 910 of the antenna. Also, the other of the electrodes of the RFID chip 804 is connected to the cover metal 903 of the cover film 904.

Even with the structure according to the fourth embodiment, illustrated in FIG. 4 is the relation between the slit length and the slit width. In order to construct an antenna having a short antenna length, it is important to shorten slit length and to widen the slit width.

Figure 11:
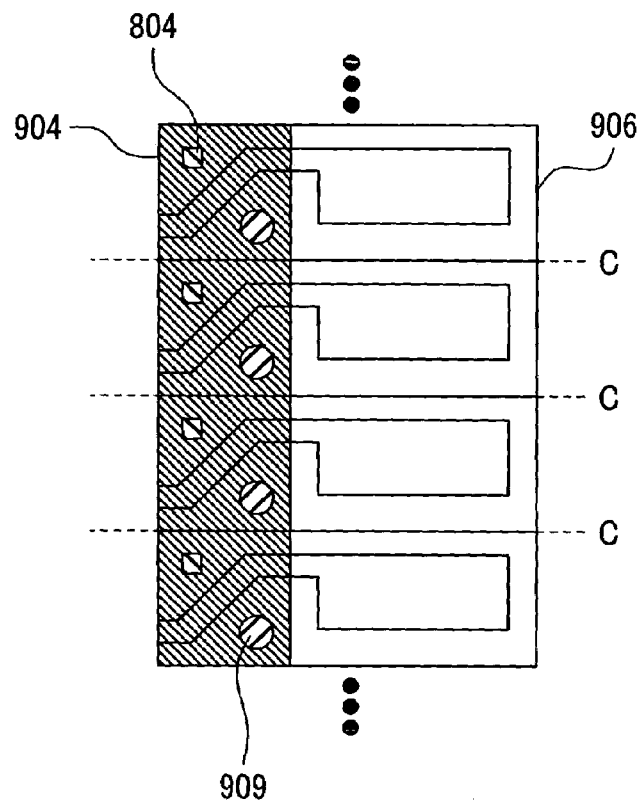
FIG. 11 is an explanatory diagram of a method of producing the RFID using the antenna according to the fifth embodiment of this invention.

Next, by referring to FIG. 11, a method of producing the RFID shown in FIGS. 10A and 10B will be described.

First, plural RFID chips 804 are mounted at predetermined positions on the base film 906 where plural antennas are continuously provided, and then the anisotropic conductive adhesives 905 are arranged. Following this, the cover film 904 where plural cover metals 903 are continuously provided is overlaid on the base film 906 and the short points 909 are pressurized from the cover film 904 side. Finally, the base film 906 and the cover film 904 are cut along the lines C. In this manner, the RFID shown in FIGS. 10A and 10B is produced.

As described above, in the fifth embodiment, providing the slit in a slanting direction makes it possible to increase the tolerance to displacements of the arrangement position of the RFID chip 804 and the position of the short point 909. As a result, the RFID can be supplied at a low price.

Figure 12:
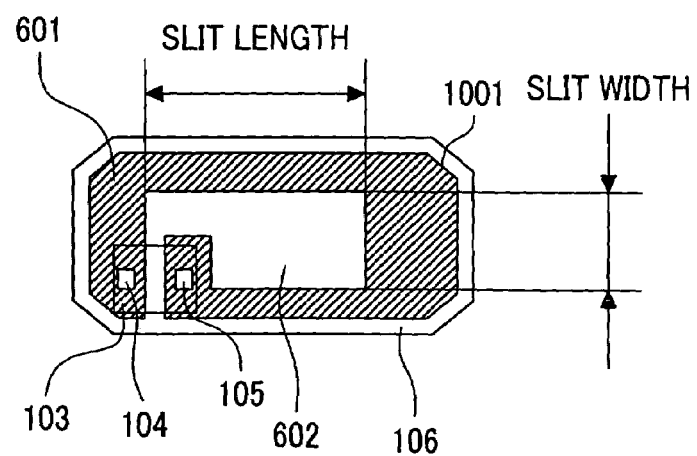
FIG. 12 is a plane view of RFID using an antenna according to a sixth embodiment of this invention.

FIG. 12 is a plane view of RFID using an antenna according to a sixth embodiment of this invention.

The antenna for the RFID according to the sixth embodiment is characterized in that the corner portions of the antenna according to the modification shown in FIG. 7 of the second embodiment are removed. It should be noted that each construction element that functions in the same manner as in the first through fifth embodiments described above is given the same reference numeral and the detailed description thereof will be omitted.

In this sixth embodiment, like in the modification shown in FIG. 7 of the second embodiment, an antenna 601 is formed by a conductive pattern on a base film 106 and a slit 602 is established in the antenna 601. In the sixth embodiment, even the corner portions 1001 of the antenna 601 are removed, a high-frequency current mainly flows in the vicinity of the center portion of the antenna 601 and does not flow in the corner portions of the antenna 601. Therefore, even the corner portions of the antenna 601 are removed, no influences are exerted on the performance of the antenna. Also, the antenna 601 is connected to a first bump 104 and a second bump 105 provided for an RFID chip 103.

Even with the structure according to the sixth embodiment, illustrated in FIG. 4 is the relation between the slit length and the slit width. In order to construct an antenna having a short antenna length, it is important to shorten the slit length and widen the slit width.

As described above, in the sixth embodiment, removing the corner portions of the antenna without exerting any influences on the performance of the antenna makes it possible to miniaturize the antenna so as to realize RFID that can be attached in a narrow and small space.

Figure 13A:
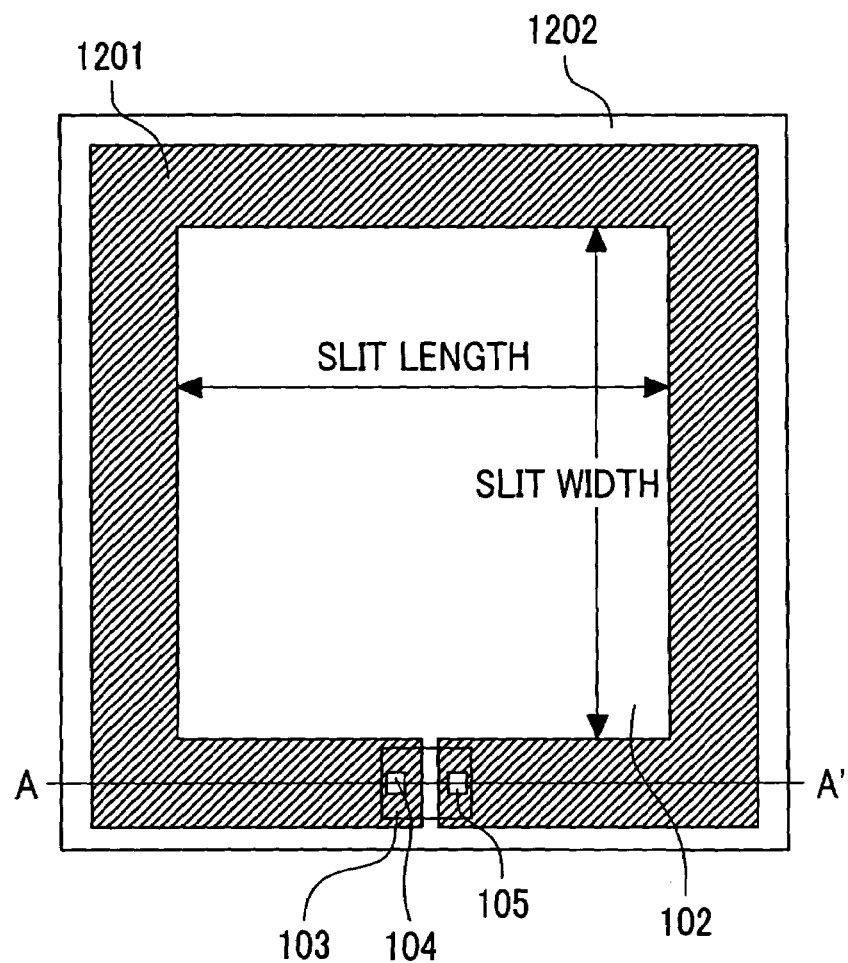
FIG. 13A is a plane view of RFID using an antenna according to a seventh embodiment of this invention.
Figure 13B:
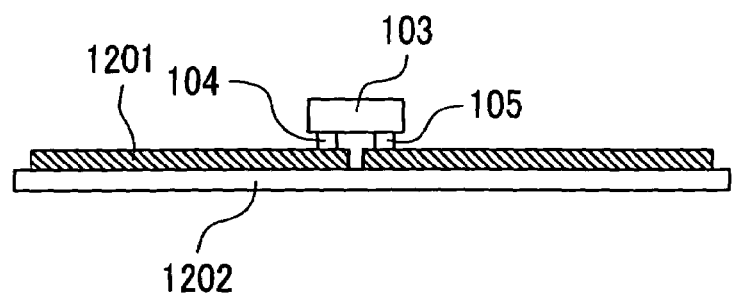
FIG. 13B is a cross-sectional view of the RFID taken along the line A-A' shown in FIG. 13A.

FIG. 13A is a plane view of RFID using an antenna according to a seventh embodiment of this invention and FIG. 13B is a cross-sectional view taken along the line A-A' of FIG. 13A.

The antenna for the RFID according to the seventh embodiment is characterized in that it has a quadrangular shaped. It should be noted that each construction element that functions in the same manner as in the first through sixth embodiments described above is given the same reference numeral and the detailed description thereof will be omitted.

In the seventh embodiment, an antenna 1201 having a quadrangular shape is formed by a conductive pattern on a base film 1202 having a quadrangular shape and a slit having a quadrangular shape is established in the antenna 1201. In other words, a shape is used in which the length of the slit and the width of the slit are set equal to each other or approximately equal to each other. Also, the antenna 1201 is connected to a first bump 104 and a second bump 105 provided for an RFID chip 103.

Figure 14A:
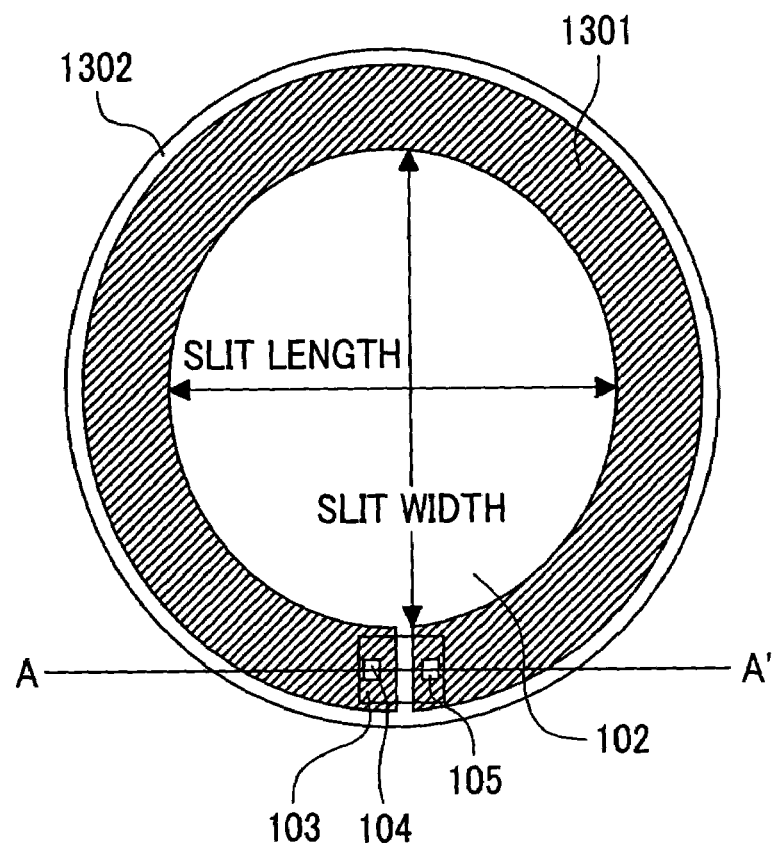
FIG. 14A is a plane view of RFID using an antenna according to an eighth embodiment of this invention.
Figure 14B:
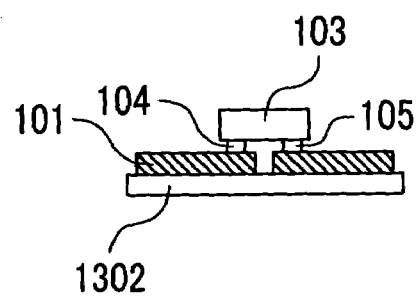
FIG. 14B is an A-A' cross-sectional view of the RFID shown in FIG. 14A.

FIG. 14A is a plane view of RFID using an antenna according to a eighth embodiment of this invention and FIG. 14B is a cross-sectional view taken along the line A-A' of FIG. 14A.

The antenna for the RFID according to the eighth embodiment is characterized in that it has a circular shape. It should be noted that each construction element that functions in the same manner as in the first through seventh embodiments described above is given the same reference numeral and the detailed description thereof will be omitted.

In the eighth embodiment, an antenna 1301 having a circular shape is formed by a conductive pattern on a base film 1302 having a circular shape and a slit having a circular shape is established in the antenna 1301. In other words, a shape is used in which the length of the slit and the width of the slit are set equal to each other or approximately equal to each other. Also, the antenna 1301 is connected to a first bump 104 and a second bump 105 provided for an RFID chip 103.

Even with the structures according to the seventh and eighth embodiments, illustrated in FIG. 4 is the relation between the slit length and the slit width. In the seventh embodiment, the slit length and the slit width are set approximately equal to each other. In other words, in this invention, the shortening of the slit length is approximately equal to the widening of the slit width and the seventh embodiment is based on the essence of this invention. It should be noted that the circuit with the circular-shaped slit as in the eighth embodiment can be the equivalent circuit same as that with the quadrangular-shaped slit.

As described above, in the seventh and eighth embodiments, setting the slit length and the slit width approximately equal to each other makes it possible to miniaturize the antenna without exerting any influences on the performance of the antenna so as to realize RFID that can be attached in a narrow and small space.

Figure 15:
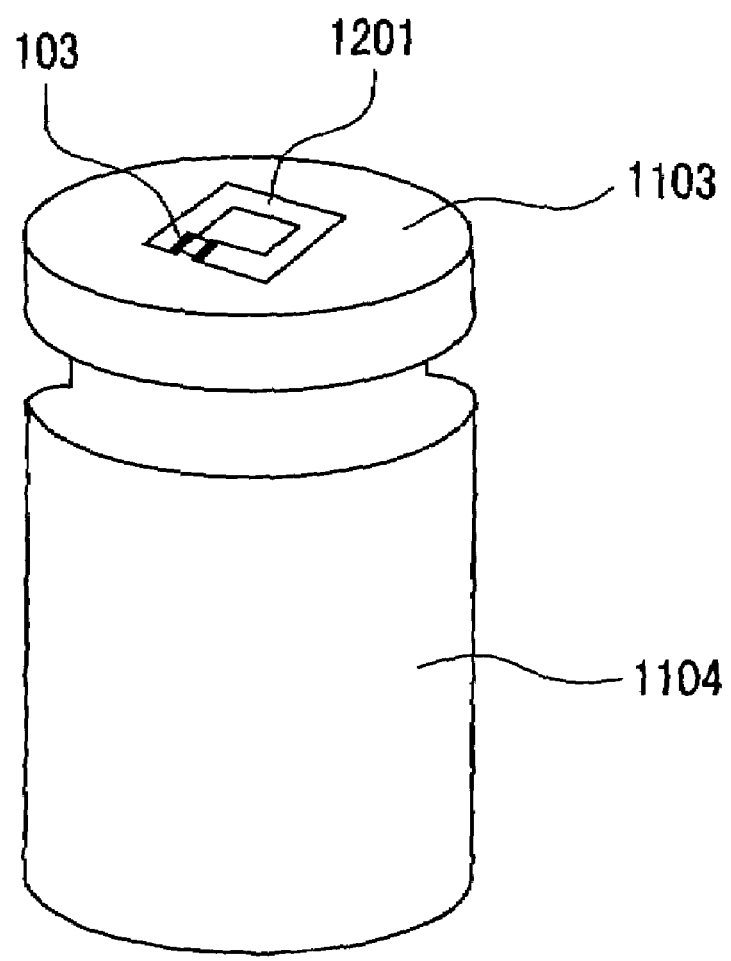
FIG. 15 is a perspective view of an embodiment where the RFID according to the embodiments of this invention is affixed to a receiving container.

FIG. 15 is a perspective view of an embodiment where the RFID according to the embodiments of this invention is affixed to a receiving container (e.g. bottle).

An RFID chip provided with the compact antenna according to this invention is attached to a lid portion 1103 of the container. Containers (bottles) made of glass, plastic, or another material are used in various fields in order to store or keep various medicines or samples, although there is a case where the mixing of foreign matters into the contents, the chemical reaction of the contents, or the like occurs during production or keeping. Therefore, it is required to periodically check the contents during the production or keeping. In order to automatically register results of the check in a computer, it is desirable that the container can be automatically identified. Conventionally, for the sake of the automatic identification, a barcode, an IC chip for wireless identification, or the like were attached to such a container. In this case, however, when the container is small, no space for affixation of a label for identification is found on the top surface or the bottom surface of the container and the label is affixed to the periphery of the container, which leads to a problem that the label interferes with the observation of the contents. With the RFID chip using the compact antenna according to this invention is attached to the lid of the bottle no matter to which position a main body 1104 of the bottle is rotated, it is possible to read the chip with ease.

The antenna according to this invention can be applied to an RFID chip. As the antenna can be miniaturized, it is suitable to be provided for the RFID that should be compact for application to the merchandise management at stores, the identification of medicines or samples, tickets for transportation or entertainments, or the like.

While the present invention has been described in detail and pictorially in the accompanying drawings, the present invention is not limited to such detail but covers various obvious modifications and equivalent arrangements, which fall within the purview of the appended claims.

What is claimed is:

1. A non-resonant antenna designated to operate at substantially 2.45 GHz and to be connected to an IC chip for wireless identification, comprising:

a conductor having an opening, the opening extending substantially 3 mm long in a first direction and 0.8-1.4 mm wide in a second direction, wherein the first direction and the second direction cross at a right angle, said opening including a contiguous gap extending from the opening through the conductor; and a first connection point for a first input terminal of the IC chip located on a first side of said gap and a second connection point for a second input terminal of the IC chip located on a second side of said gap, wherein the opening constitutes a distributed constant circuit, and wherein an impedance of the distributed constant circuit matches an input impedance of the IC chip.

2. The antenna according to claim 1, wherein an input impedance of the IC chip is approximately 60 ohms.

3. The antenna according to claim 1, being formed between a base film and a cover film, wherein the cover film having an electric conductor is provided at least a part of the base film, the antenna formed on the base film and the electric conductor of the cover film are connected at a short point, and the IC chip is arranged between the base film and the cover film and is connected to both of the base film and the cover film.

4. The antenna according to claim 3, wherein the antenna formed on the base film and the electric conductor of the cover film are connected at the short point by the anisotropic conductive adhesives arranged between the base film and the cover film.

5. The antenna according to claim 1, wherein
the antenna has an extending folded portion,
the folded portion is folded to a position overlapping the antenna,
the IC chip has terminals for connection on its both surfaces, and
the antenna and the folded portion are connected to the IC chip.

6. The antenna according to claim 1, wherein the antenna is formed on a high-dielectric-constant base film and is covered with a high-dielectric-constant cover sheet.

7. The antenna according to claim 1, wherein the antenna has a square shape and corner portions of the antenna are removed in a slanting direction.

8. Radio frequency identification comprising the antenna according to claim 1.

9. A container that is capable of holding one of powder and liquid, comprising radio frequency identification comprising the antenna according to claim 1, wherein
the radio frequency identification is provided in one of a main body portion and a lid portion of the container.

10. The antenna according to claim 1, further comprising a base film, wherein the conductor is a conductive pattern formed on the base film.

11. The antenna according to claim 10, wherein the base film is made of high dielectric constant material.

12. The antenna according to claim 1, wherein the antenna has a rectangular shape.

13. The antenna according to claim 1, wherein
the IC chip comprises a rectifier circuit; and
the rectifier circuit rectifies a current flowing between the input terminals.

14. The antenna according to claim 1, wherein
the IC chip comprises a rectifier circuit; and
the rectifier circuit rectifies the current flowing between the input terminals; and
the input terminals are provided on both sides of the IC chip.

15. The antenna according to claim 1, wherein a current mainly flows in a vicinity of a center portion of the non-resonant antenna and does not flow in corner portions of the non-resonant antenna.

16. The antenna according to claim 1, wherein
an inductance exists the along an opening length of the first direction;
a capacitance exists inversely proportional to an opening width of the second direction; and
the impedance of the distributed constant circuit comprising the inductance and the capacitance matches an input impedance of the IC chip.

17. A non-resonant antenna designated to operate at substantially 2.45 GHz and to be connected to an IC chip for wireless identification, comprising:
a conductor making up said antenna, said conductor having an opening extending 2.4-3.0 mm long in a first direction, and extending 0.8-1.4 mm wide in a second direction, wherein said first direction and said second direction cross at a right angle to achieve an opening area of 3.0-4.2 square mm, said opening including a contiguous gap extending from the opening through the conductor; and
a first connection point for a first input terminal of the IC chip located on a first side of said gap and a second connection point for a second input terminal of the IC chip located on a second side of said gap,
wherein the opening constitutes a distributed constant circuit, and
wherein an impedance of the distributed constant circuit matches an input impedance of the IC chip.

18. A non-resonant antenna designed to operate at substantially 2.45 GHz band and to be connected to an IC chip for wireless identification, comprising:
a conductor having a long narrow opening that extends 2.4-3.0 mm long in a first direction and 0.8-1.4 mm wide in a second direction, wherein first direction and the second direction cross at a right angle to achieve an opening area of 3.0-4.2 square millimeters, said opening including a contiguous gap extending from the opening through the conductor so that said opening is not closed on one side; and
a first connection point for a first input terminal of the IC chip located on a first side of said gap and a second connection point for a second input terminal of the IC chip located on a second side of said gap,
wherein an inductance exists the along an opening length of the first direction;
wherein a capacitance exists inversely proportional to an opening width of the second direction;
wherein an impedance of the distributed constant circuit comprising the inductance and the capacitance matches an input impedance of the IC chip; and
wherein a current mainly flows in a vicinity of a center portion of the non-resonant antenna and does not flow in corner portions of the non-resonant antenna.

* * * * *